US012754240B2

(12) United States Patent
Kabra et al.

(10) Patent No.: US 12,754,240 B2
(45) Date of Patent: Oct. 6, 2026

(54) METHOD AND SYSTEM UTILIZING PULSE VOLTAMMETRY FOR TESTING BATTERY

(71) Applicants: Purdue Research Foundation, West Lafayette, IN (US); CFD Research Corporation, Huntsville, AL (US)

(72) Inventors: Venkatesh Kabra, West Lafayette, IN (US); Partha Mukherjee, West Lafayette, IN (US); James Cole, Huntsville, AL (US); Paul Northrop, Huntsville, AL (US); Conner Fear, Glen Ellen, CA (US)

(73) Assignees: Purdue Research Foundation, West Lafayette, IN (US); CFD Research Corporation, Huntsville, AL (US)

(*) Notice: Subject to any disclaimer, the term of this patent is extended or adjusted under 35 U.S.C. 154(b) by 644 days.

(21) Appl. No.: 18/201,043

(22) Filed: May 23, 2023

(65) Prior Publication Data

US 2024/0094297 A1 Mar. 21, 2024

Related U.S. Application Data

(60) Provisional application No. 63/345,302, filed on May 24, 2022.

(51) Int. Cl.
*G01R 31/36* (2020.01)
*G01R 31/367* (2019.01)
(Continued)

(52) U.S. Cl.
CPC ....... *G01R 31/3648* (2013.01); *G01R 31/367* (2019.01); *G01R 31/3842* (2019.01); *G01R 31/392* (2019.01)

(58) Field of Classification Search
CPC .............. G01R 31/3648; G01R 31/367; G01R 31/3842; G01R 31/392; G01R 31/386; G01R 31/387
See application file for complete search history.

(56) References Cited

U.S. PATENT DOCUMENTS

| | | | | |
|---|---|---|---|---|
| 5,744,962 A * | 4/1998 | Alber | G01R 31/385 324/426 |
| 2012/0310565 A1* | 12/2012 | Redey | G01R 31/392 702/63 |
| 2022/0334188 A1* | 10/2022 | Burcar | G01R 31/38 |

FOREIGN PATENT DOCUMENTS

| | | | |
|---|---|---|---|
| EP | 4184649 A1 * | 5/2023 | H01M 4/136 |
| WO | WO-2022008235 A1 * | 1/2022 | H01M 10/0525 |

OTHER PUBLICATIONS

EP-4184649-A1_translated (Year: 2023).*
(Continued)

*Primary Examiner* — Catherine T. Rastovski
*Assistant Examiner* — Michael J Singletary
(74) *Attorney, Agent, or Firm* — Piroozi-IP, LLC

(57) ABSTRACT

A state of battery testing system is disclosed which includes a charger, a load to be coupled across the battery's positive and negative terminals, a processer adapted to apply a predetermined voltage pulse across the battery's positive and negative terminals, apply the load to the battery, measure and log current through the load as $I_{exp}$, and establish a model based on establishing an initial estimation of state of the battery ($\theta_0$), and establishing a modeled state of battery ($\theta_i$) based on a plurality of internal parameters of the battery. The model is adapted to output a model current through the load, inputting $\theta_0$ and the plurality of internal parameters of the model to thereby generate $I_{model}$, generate
(Continued)

an objective function ($f$) based on a comparison of $I_{model}$ and $I_{exp}$, and iteratively optimize $\theta_i$, and output $\theta_{optimal}$ based on the iterations.

20 Claims, 5 Drawing Sheets

(51) Int. Cl.
*G01R 31/3842* (2019.01)
*G01R 31/392* (2019.01)

(56) References Cited

OTHER PUBLICATIONS

WO-2022008235-A1_translated (Year: 2022).*
Severson et al., Data-Driven Prediction of Battery Cycle Life before Capacity Degradation. Nat. Energy 2019, 4(5):383-391.
Patil et al., A Novel Multistage Support Vector Machine Based Approach for Li Ion Battery Remaining Useful Life Estimation. Appl. Energy 2015, 159:285-297.
O'Dea et al., Determining Kinetic Parameters from Pulse Voltammetric Data. J. Phys. Chem. 1986, 90(12):2761-2764.
Mirceski et al., Square-wave Voltammetry: A Review on the Recent Progress. Wiley Online Libr. 2013, 25(11):2411-2422.
O'Dea et al., Theory of Square Wave Voltammetry for Kinetic Systems. Anal. Chem. 2002, 53 (4): 695-701.
Dubarry et al., Synthesize Battery Degradation Modes via a Diagnostic and Prognostic Model. J. Power Sources 2012, 219:204-216.
Dubarry et al., Identify Capacity Fading Mechanism in a Commercial LiFePO4 Cell. J. Power Sources 2009, 194(1):541-549.
Northrop et al., A Pulse Voltammetry Analysis Toolkit for Battery and Fuel Cell Material. ECS Transactions, 2018, 35(5):23.
Stroe et al., Diagnosis of lithium-ion batteries state-of-health based on electrochemical impedance spectroscopy technique. In 2014 IEEE Energy Conversion Congress and Exposition (ECCE), Sep. 2014, 4576-4582.
Messing et al., Estimating battery state of health using electrochemical impedance spectroscopy and the relaxation effect. Journal of Energy Storage, 2021, 43, 103210.
Li et al., Health and performance diagnostics in Li-ion batteries with pulse-injection-aided machine learning. Applied Energy, 2022, 315, 119005.
Cui et al., State of health diagnosis model for lithium ion batteries based on real-time impedance and open circuit voltage parameters identification method. Energy, 2018, 144:647-656.
Li et al., Characterizing degradation in lithium-ion batteries with pulsing. Journal of Power Sources, 2023, 580, 233328.
Khumprom et al., A data-driven predictive prognostic model for lithium-ion batteries based on a deep learning algorithm. Energies, 2019, 12(4), 660.
Zhu et al., Data-driven capacity estimation of commercial lithium-ion batteries from voltage relaxation. Nature communications, 2022, 13(1), 2261.
Chemali et al., State-of-charge estimation of Li-ion batteries using deep neural networks: A machine learning approach. Journal of Power Sources, 2018, 400:242-255.
Berecibar et al., Online state of health estimation on NMC cells based on predictive analytics. Journal of Power Sources, 2016, 320:239-250.

* cited by examiner

METHOD AND SYSTEM UTILIZING PULSE VOLTAMMETRY FOR TESTING BATTERY

CROSS-REFERENCE TO RELATED APPLICATIONS

The present non-provisional patent application is related to and claims the priority benefit of U.S. Provisional Patent Application Ser. No. 63/345,302, entitled METHOD AND SYSTEM UTILIZING PULSE VOLTAMMETRY FOR TESTING BATTERY which was filed May 24, 2022, the contents of which are hereby incorporated by reference in its entirety into the present disclosure.

STATEMENT REGARDING GOVERNMENT FUNDING

This invention was made with government support under contract number W911NF-19-C-0084 awarded by the Army Research Office. The government has certain rights in the invention.

TECHNICAL FIELD

The present disclosure generally relates to a battery testing arrangement, and in particular, to a battery testing arrangement utilizing pulse voltammetry.

BACKGROUND

This section introduces aspects that may help facilitate a better understanding of the disclosure. Accordingly, these statements are to be read in this light and are not to be understood as admissions about what is or is not prior art.

Li-ion batteries are a ubiquitous part of the modern-day lifestyle, fulfilling a variety of applications ranging from portable electronics to electric vehicles, grid power, and the current development of urban air mobility such as electric vertical takeoff and landing vehicles (e-VTOL). Due to these ever-growing performance requirements, Li-ion batteries have progressively evolved and still have a scope for improvement by modification at a hierarchy of length scales. The current limitations to Li-ion batteries include rate capability during charge/discharge, energy/power density tradeoffs, sub-ambient temperature cycle life, and thermal safety characteristics.

These batteries go through a large number of charge-discharge cycles. Such dynamic cycling profiles of the battery are achieved at the cost of severe degradation to the cell components at various length scales. The electrodes undergo significant structural damage, such as the formation of cracks in active material particles due to rapid lithiation de-lithiation resulting in diffusion-induced stress damages. Additionally, parasitic side reactions also cause the loss of lithium inventory and electrolyte depletion, forming a passivating layer on electrode particles which further hinders the charge transfer kinetics.

For critical applications such as electric vehicles and electric-vertical takeoff landing vehicles, the user of the battery needs to be aware of the available useful life of the Li-ion battery for early decision-making and avoiding unforeseen circumstances. Physics-based models that can capture the dominant electrochemical physics and interactions of fields thereof are available, as long as a proper set of physical parameters are chosen. Various types of degradation-induced damages affect the charging/discharging behavior in dissimilar ways, but the large number of parameters involved in physics-based models make it difficult to deconvolute the effects of specific degradation modes from cycling data alone. Also, some of the simpler models such as circuit-based, and reduced-order models have difficulty in assigning physically relevant degradation modes, reducing their utility in predicting capacity and power fade over the life of the cell.

Examples of model-based methods of testing a battery are enumerated. First is a technique referred to as electro-impedance spectroscopy (EIS). This method includes applying a harmonic excitation signal. The frequency of these pulses usually varies between 1 mHz to 10 kHz. In response thereto the current response of the Li-ion battery is a measure. By plotting the current response vs. the input voltage, real and imaginary parts of an impedance are thus plotted based on a simplified equivalent circuit model representing a changing impedance. Based on this equivalent circuit the battery can be modeled. With battery aging, the impedance of the battery increases, thus signifying diminishing of the state of health of the battery.

The second and third model-based methods for the testing state of health of a battery are the galvanostatic intermittent titration technique (GITT) and potentiostatic intermittent titration technique (PITT). In these methods rectangular pulses are applied to a Li-ion cell. In GITT, the current pulses are applied for some amount of time followed by a period of rest for equilibrium attainment. The diffusion can be interpreted by the relaxation profile based on the formula noted in Eq. (1).

$$D_s = \frac{4}{\pi}\left(\frac{iV_m}{z_A FS}\right)^2 \left[\frac{\left(\frac{dE}{dy}\right)}{\left(\frac{dE}{d\sqrt{t}}\right)}\right]^2 \tag{1}$$

In which, $D_s$ is the solid phase diffusion coefficient, $V_m$ is the molar volume for the electrode material, S is the contact area between the electrode and electrolyte, i is the applied current, F is the Faraday constant, $z_A$ is the charge number of the electroactive species, the value of $dV/d\sqrt{t}$ is determined from the graph of measured voltage (during constant current pulse) vs. the square root of time, and the value of $dU^0/dy$ is calculated from the plot of the open circuit potential of the electrode material, by determining the change in open circuit potential per unit intercalation fraction of the electrode material.

Similarly in PITT-based methods, potential pulses are applied for a brief time, followed by the current shutoff and repetition. This method is also used for solid-phase diffusivity calculations as shown in Eq. (2).

$$i = \frac{2FS(C_s - C_0)D_s}{L}\exp\left(-\frac{\pi^2 D_s t}{4L^2}\right) \tag{2}$$

$$D_s = \frac{d\ln(i)}{dt}\frac{4L^2}{\pi^2}$$

In which, i is the current resulting from the constant voltage pulses to the Li-ion cell, F is the faraday's constant, S is the surface area of the electrode, $(C_s-C_0)$ is the concentration difference of Li-ions at the surface at time t and at the beginning of potential pulse (t=0), $D_s$ is the solid phase diffusion coefficient, and L is the characteristic length of the electrode active material.

A fourth method utilized in determining battery health is referred to as the differential voltage analysis technique. This method requires a low-rate discharging voltage capacity data of the cell. In this method, the cell voltage is differentiated with respect to the capacity of the cell. The peaks in the full cell voltage curve are originating from either of the two electrodes. With the aging/degradation of the battery, these peaks shift towards the left or right. Based on tracking the shift of these peaks one can quantify the loss of active material and loss of Li-inventory.

However, all of the above-enumerated methods are based on rudimentary modeling of the battery. For example, the EIS technique is based on impedance characterization without regard as to how the impedance change is affected. Because these techniques do not effectively model the internal parameters of a battery, their accuracy is limited.

Therefore, there is an unmet need for a novel approach to determine the state of a battery based on a model that incorporates chemical and physical parameters of the battery.

SUMMARY

A state of battery testing system is disclosed. The system includes a charger adapted to charge and test a battery having a positive and negative terminals, a load adapted to be selectively coupled across the positive and negative terminals of the battery, a controller having a processer executing software on a non-transient memory and adapted to apply a predetermined voltage pulse across the positive and negative terminals of the battery, selectively apply the load to the battery, measure current through the load, log the measured current as $I_{exp}$, and establish a model. The model is established based on establishing an initial estimation of state of the battery $(\theta_0)$ based on a set of parameters including a) reaction rate constant for intercalation $(k_0)$ for electrodes of the battery, b) average particle size of active material $R_{s0}$, and c) a Li-intercalation fraction of the electrode $(Y_0)$, establishing a modeled state of battery $(\theta_i)$ based on a plurality of internal parameters of the battery. The model is adapted to output a model current $(I_{model})$ through the load disposed between a modeled positive and negative terminals, inputting $\theta_0$ and the plurality of internal parameters to the model, thereby generating the $I_{model}$, generate an objective function $(f)$ based on a comparison of $I_{model}$ and $I_{exp}$, and iteratively optimize $\theta_i$ $(\theta_{optimal})$ in a loop based on the objective function $f$, and a gradient (g) of objective function $f$. The processor is further adapted to update $\theta_i$ ($k_i$, $R_{si}$, and $Y_i$) based on direction of the steepest descent of $f$, and determine if change in $\theta_i$ as compared to values from an immediate previous iteration exceeds a predetermined limit: if no, then output $\theta_{optimal}$, and if yes, then update $\theta_0$ to $\theta_i$ and repeat the loop.

A battery testing method is also disclosed. The method includes charging a battery having a positive and negative terminals, applying a predetermined voltage pulse across the positive and negative terminals of the battery, selectively coupling a load across the positive and negative terminals of the battery, measuring current through the load, logging the measured current as $I_{exp}$, establishing a model based on establishing an initial estimation of state of the battery $(\theta_0)$ based on a set of parameters including a) reaction rate constant for intercalation $(k_0)$ for electrodes of the battery, b) average particle size of active material $R_{s0}$, and c) a Li-intercalation fraction of the electrode $(Y_0)$, establishing a modeled state of battery $(\theta_i)$ based on a plurality of internal parameters of the battery, wherein the model is adapted to output a model current $(I_{model})$ through the load disposed between a modeled positive and negative terminals, and inputting $\theta_0$ and the plurality of internal parameters to the model, thereby generating the $I_{model}$. The model further includes generating an objective function $(f)$ based on a comparison of $I_{model}$ and $I_{exp}$, and iteratively optimizing $\theta_i$ $(\theta_{optimal})$ in a loop based on objective function $f$, and gradient (g) of objective function $f$, updating $\theta_i$ ($k_i$, $R_{si}$, and $Y_i$) based on direction of the steepest descent of $f$, and determining if change in $\theta_i$ as compared to values from an immediate previous iteration exceeds a predetermined limit. If no, then outputting $\theta_{optimal}$. If yes, then updating $\theta_0$ to $\theta_i$ and repeating the loop.

DETAILED DESCRIPTION

Figure 1A:
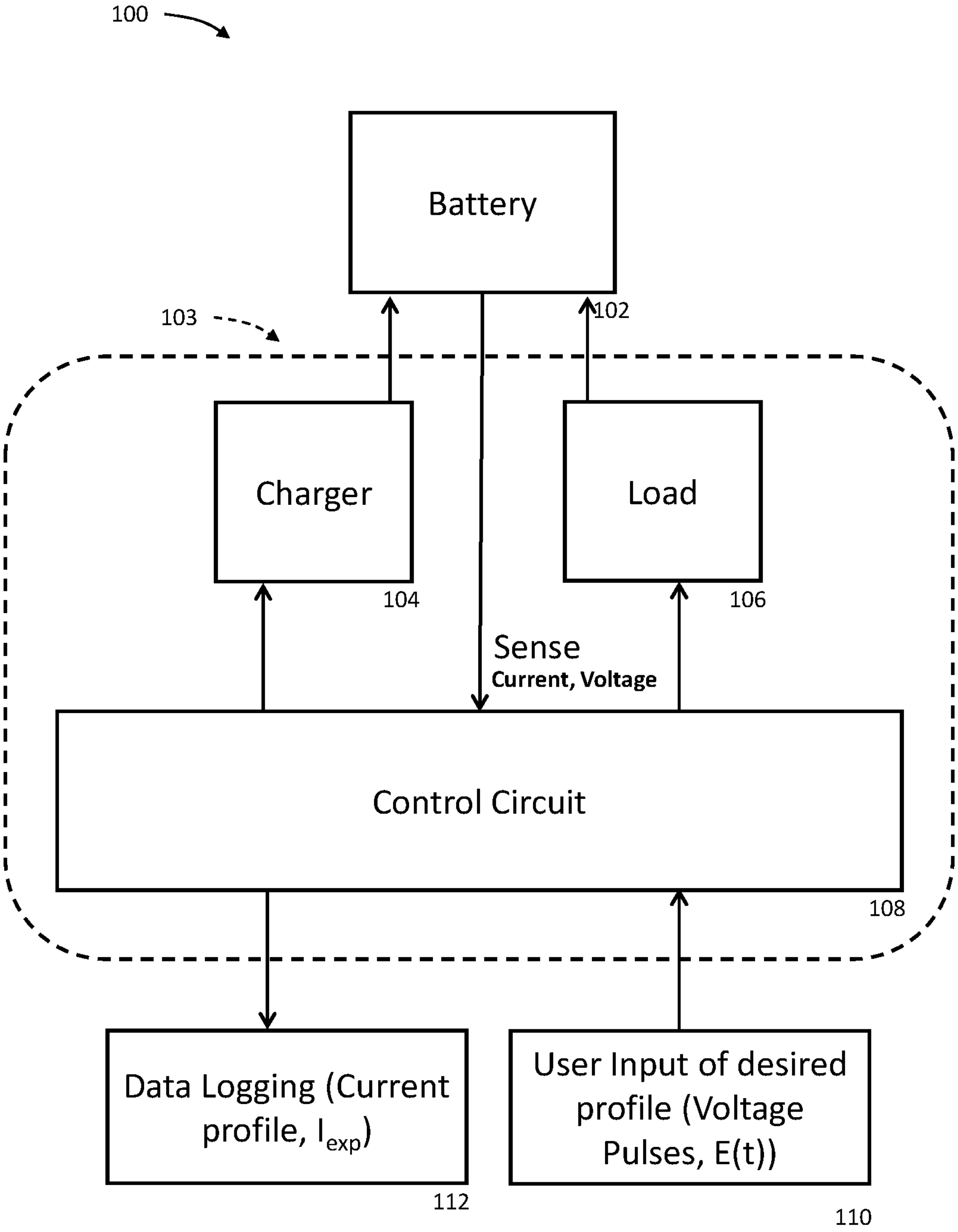
FIG. 1A is a block diagram that depicts a battery and a battery management system, according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach is presented herein to determine the state of a battery based on a model that incorporates chemical and physical parameters of the battery. To resolve the shortcomings of known techniques, a differential pulse voltammetry (DPV) method is disclosed herein which inherently contains the kinetic and thermodynamic information of a Li-ion battery, facilitating the development of accurate state of battery estimations and evaluations. This estimation method's superiority lies in application of a voltage pulse train and coupling it with a detailed physics-based model of battery, capturing the physically relevant degradation modes. The method is capable of testing batteries aged under variety of scenarios allowing for in-situ quantification and tracking of the degradation mechanisms occurring inside of the cell, making it relevant for various critical applications.

Referring to FIG. 1A, a block diagram for a battery management testing system 100 is shown. The battery management testing system 100 describes the approach used according to the present disclosure on how to test a battery 102 upon startup (i.e., each time a vehicle is turned on, or an alternative testing schedule). The battery management testing system 100 includes a battery management system (BMS) 103 which is responsible for test charging the battery 102. The BMS 103, thus includes a charger 104, a load 106 and control circuit 108 which are electrically coupled to the battery 102. A control circuit 108 provides control for the charger 104 (i.e., provides voltage waveforms) and the load 106 (i.e., switching the load 106 across the terminals of the battery 102). During the battery testing, it is coupled to the load and charger which are controlled by the control circuit to apply voltage pulses. The current flowing across the load 106 is measured and sensed by the control circuit 108. The control circuit 108 may be configured to receive a user input voltage profile 110 or a hard-programmed voltage profile in a non-transitory memory (not shown) residing in the control circuit 108. A data logging block 112 is also used to capture the $I_{exp}$ values for comparison to $I_{model}$ values (discussed below).

Figure 1B:
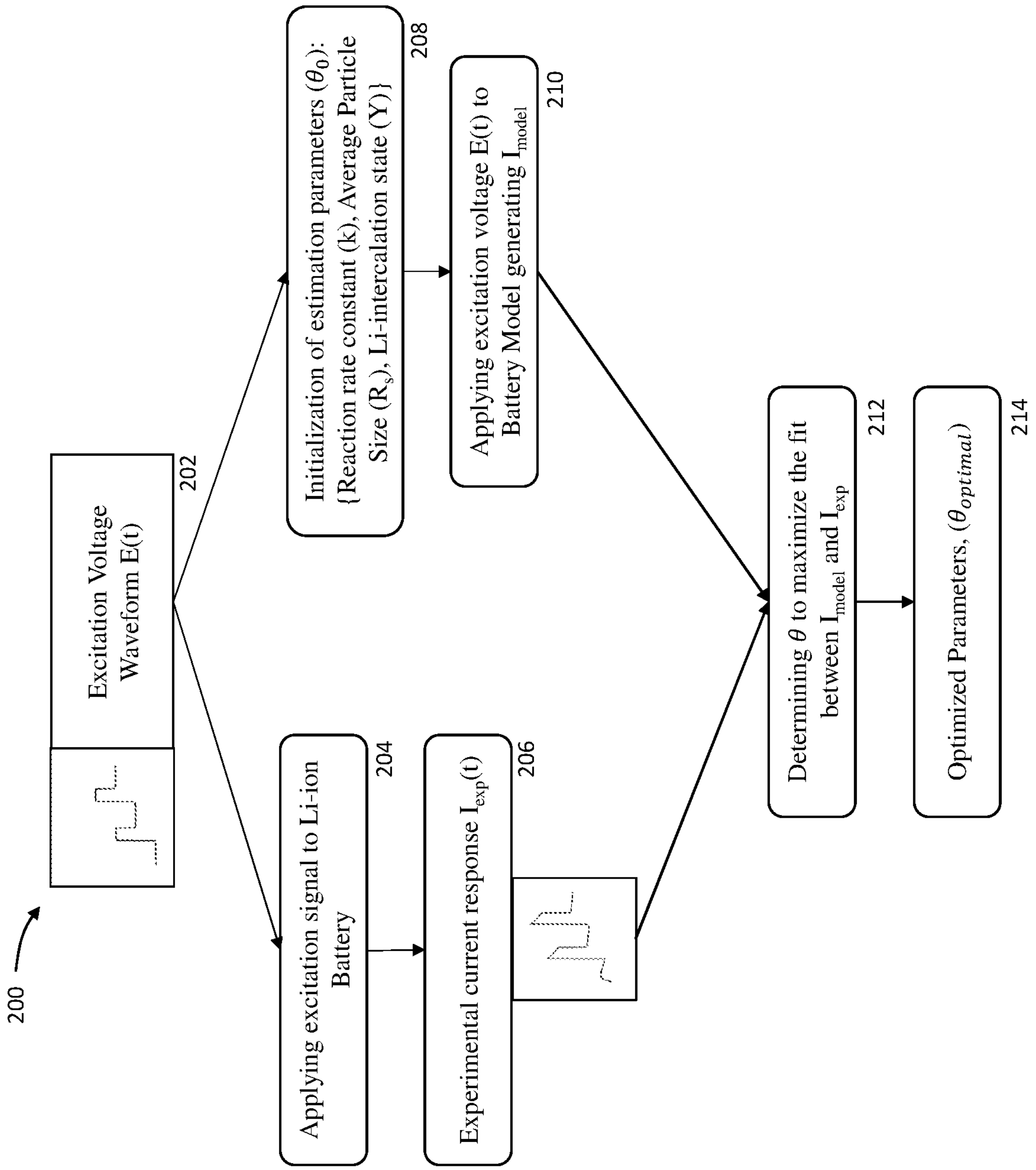
FIG. 1B is a flowchart which delineates steps taken in determining the state of a battery, according to the present disclosure.

Referring to FIG. 1B, a flowchart 200 is provided which delineates the method of determining the battery parameters θ. These battery parameters are useful in estimating the state of a battery (e.g., state of health, state of charge) according to the present disclosure. As shown in FIG. 1B, the battery parameters are quantified using a parameter θ. θ is based on a plurality of electrode parameters including k which represents an intercalation reaction rate constant, $R_s$ which represents the average size of the electrode active material particle, and Y which represents the Li-intercalation state of the electrode. The Li-intercalation state is the ratio of solid-phase Li-concentration in the electrode to the theoretically maximum solid-phase Li-concentration in the electrode ($C_s/C_{s.max}$). For determining the battery parameter θ, it is estimated as described below. An excitation voltage waveform denoted as E(t) (differential voltage pulse) is provided in the form of a cyclic waveform, e.g., a pulse train, as referenced by 202, as discussed with reference to FIG. 1B. The battery 102 is subjected to these excitation pulses applied across its positive and negative terminals in the startup process discussed above, as referenced by 204. Given this excitation voltage waveform, an output current is generated across the terminals of the battery denoted as $I_{exp}(t)$, which is measured by application of the load 106 (i.e., a resistor) placed between the terminals of the battery 102, as referenced by 206. Correspondingly, identical voltage waveform E(t) is applied to a battery model with initial battery parameters ($\theta_0$) 208, as referenced by 210. The model current ($I_{model}(t)$) is based on a robust model as compared to the existing techniques discussed above, the details of model are discussed below. The predicted $I_{model}$ is then compared to $I_{exp}$ to determine the fit between both for a given set of parameters $\theta_i$, as referenced by 212. These parameters θ are calculated in an iterative fashion to check the match between model and experimental current as referenced by 212. This is continued till the point of maximization of fit, referring to the corresponding parameter set as optimal parameter set $\theta_{optimal}$ as referenced by 214.

Figure 2A:
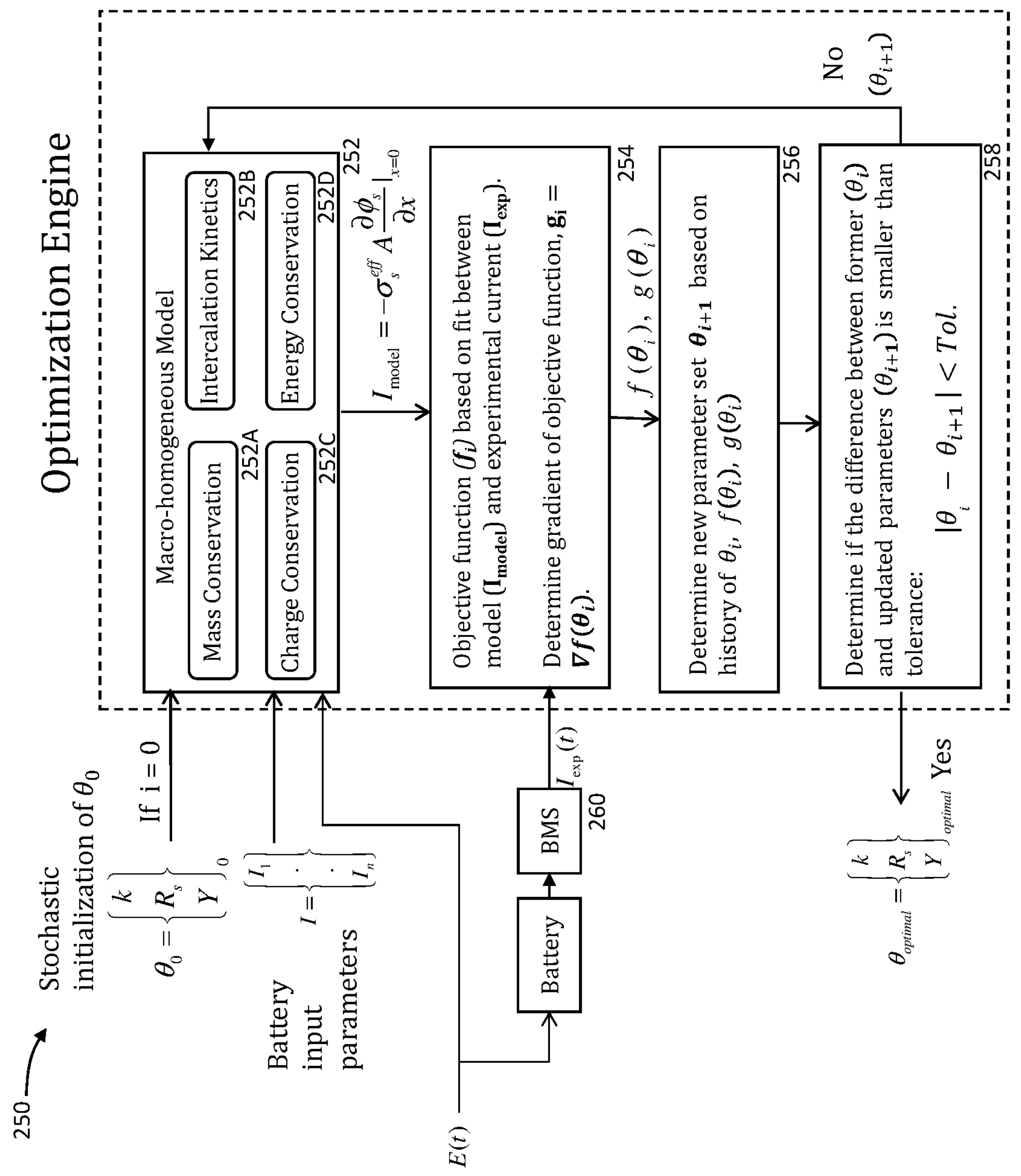
FIG. 2A is a block diagram that provides a step-by-step description of the steps involved in the optimization engine method of the present disclosure.

As discussed above, the method relies on detailed physics-based battery model, such that tracking of parameters is directly applicable to state of battery modeling and decision making. Specifically, to describe the battery model according to the present disclosure (denoted as the macro-homogenous model), four separate sub-models are defined based on i) mass conservation, ii) intercalation kinetics, iii) charge conservation, and iv) energy conservation as shown in FIG. 2A in which a block diagram of an optimization engine 250 is depicted, all further discussed below. These sub-models are tightly coupled, and the solution of each sub-model affects each of the other sub-models. Thus, it is necessary to solve the sub-models simultaneously to generate the full macro-homogeneous model solution and predict the battery behavior. Apart from the above-described battery parameter set (θ) which is to be estimated, the macro-homogeneous model accepts the input parameters $I_1 \ldots I_n$ of the battery as shown in FIG. 2A. The parameters are listed in the Table 1. The parameters provided herein are applicable to a lithium-ion battery, e.g., the LGChem 18650 Li-ion cell, tested in an actual reduction to practice. The model and procedure described are general and applicable to different battery types and chemistry, where these parameters $I_1 \ldots I_n$ will need to be determined for each different battery type under consideration. The parameters shown in Table 1 are incorporated into the sub-models of the macro-homogenous model. The additional list of symbols and nomenclature used to describe the equations of the macro-homogeneous model are presented in Table 2.

TABLE 1

Battery input parameters ($I_1 \ldots I_n$) and Estimation parameter set (θ):

| Parameter | Description | Values (descriptor "about" is applied to each value) |
|---|---|---|
| Estimation parameter set (θ) as shown in FIG 2A: | | |
| k | Reaction rate constant for intercalation | Estimated based on the differential pulse voltammetry (DPV) |
| $R_s$ | Particle size of active material | |
| $Y = C_s/C_{s,max}$ | Li-intercalation fraction of the electrode | |

TABLE 1-continued

Figure 3A:
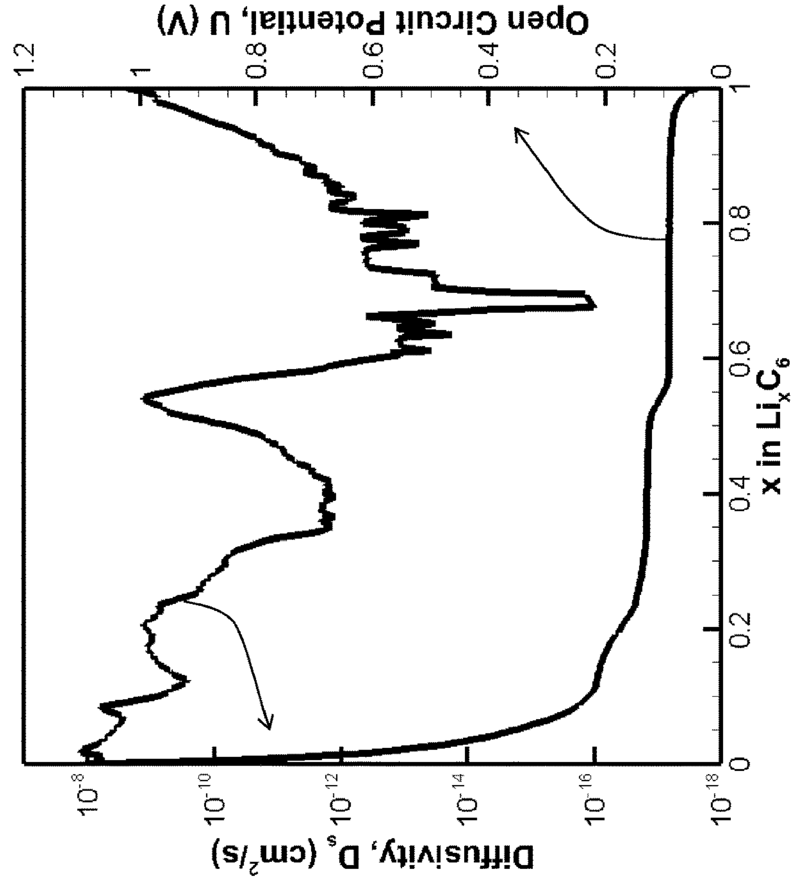
FIGS. 3A and 3B are plots of diffusivity in $cm^2/s$ and open circuit potential in V vs. x in $Li_xC_6$ (FIG. 3A) and x in $Li_x[NiCoMn]O_2$ (FIG. 3B).
Figure 3B:
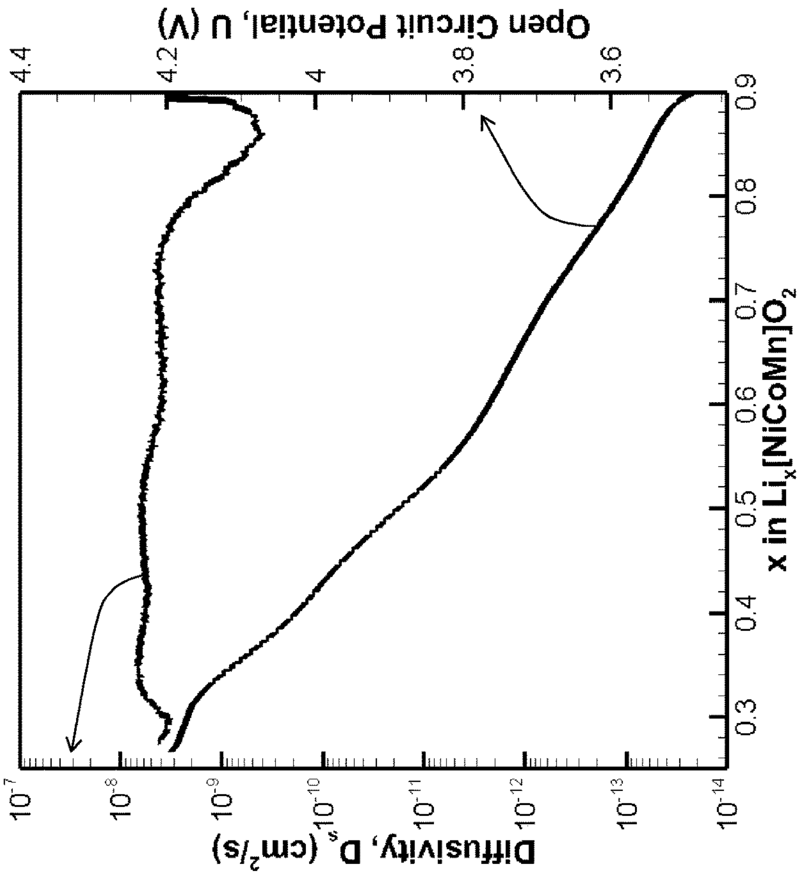

| Parameter | Description | Values (descriptor "about" is applied to each value) |
|---|---|---|
| | **Battery input parameters ($I_1 \ldots I_n$) and Estimation parameter set ($\theta$):** | |
| | **Battery input parameters ($I_1 \ldots I_n$) as shown in FIG 2A:** | |
| $a_s$ | Electrochemically active area [$m^2/m^3$] | $a_{and} = 105808$, $a_{cat} = 62731$ |
| $a_0$ | Ideal active area [$m^2/m^3$] | $a_{0,and} = 186900$, $a_{0,cat} = 393187$ |
| A | Cross-section area of cell electrodes [$m^2$] | $1074.15 \times 10^{-4}$ |
| $C_{e,0}$ | Initial electrolyte concentration [$mol/m^3$] | 1000 |
| $mC_p$ | Cell heat capacity [J/K] | 36.212 |
| $C_{s,max}$ | Maximum Li-Concentration in solid phase [$mol/m^3$] | $C_{cat,max} = 50050$, $C_{and,max} = 36170$ |
| $D_e$ | Electrolyte phase diffusion [$m^2/s$] | $D_e = 10^{-8.43-\left(\frac{54}{T-\left(229+\left(\frac{5C_e}{1000}\right)\right)}\right)-0.22C_e/1000}$ |
| $D_s$ | Solid-Phase Diffusion [$m^2/s$] | Refer to FIGS. 3A and 3B |
| $E_{act}(k)$ | Activation Energy of the intercalation constant [J/mol] | $E_{act,and} = 68000$ $E_{act,\ cat} = 50000$ J/mol |
| $E_{act}$ ($D_s$) | Activation Energy of the solid phase diffusion [J/mol] | $E_{act,and} = 30000$ $E_{act,\ cat} = 30000$ J/mol |
| h | Convective Heat Transfer Coefficient [$W/m^2 - K$] | 28 |
| k | Reaction rate constant for intercalation [$m^{1.4}mol^{0.2}$] | $K_{and} = 6.1659 \times 10^{-6}$, $k_{cat} = 6.9358 \times 10^{-6}$ |
| $\kappa_D$ | Electrolyte diffusional conductivity [A/m] | $-\frac{2R_{gas}T}{F}\left(\begin{array}{l} 0.601-\left(0.24\left(\frac{C_e}{1000}\right)^{0.5}\right)+ \\ 0.982(1-(0.0052(T-294)))\left(\frac{C_e}{1000}\right)^{3/2} \end{array}\right)$ |
| $\kappa_e$ | Ionic Conductivity of the electrolyte [S/m] | $\left(\begin{array}{c} -10.5+(0.0740T)-\left(6.69\times10^{-5}T^2\right)+ \\ (0.668(C_e/1000))-(0.0178(C_e/1000)T)+ \\ \left(2.80\times10^{-5}(C_e/1000)T^2\right)+ \\ \left(0.494(C_e/1000)^2\right)-\left(8.86\times10^{-4}(C_e/1000)^2\right)T \end{array}\right)^2 \frac{C_e}{10^4}$ |
| $t^+$ | Electrolyte Transference number [−] | 0.363 |
| ε | Electrode porosity [−] | $\varepsilon_{and} = 0.321$ $\varepsilon_{sep} = 0.4$ $\varepsilon_{cat} = 0.18$ |
| $\varepsilon_{AM}$ | Active Material volume fraction [−] | $\varepsilon_{AM,\ and} = 0.6374$ $\varepsilon_{AM,\ cat} = 0.7711$ |
| τ | Pore-phase tortuosity [−] | $\tau_{and} = 3.64$ $\tau_{sep} = 1.58$ $\tau_{cat} = 4.03$ |
| $\sigma_s^{eff}$ | Effective electronic conductivity [S/m] | $\sigma_{s,and}^{eff} = 100$, $\sigma_{s,cat}^{eff} = 34.8$ |
| L | Thickness of the electrode [μm] | $L_{and} = 49$ μm $L_{sep} = 20$ μm $L_{cat} = 45$ μm |
| $R_s$ | Particle radius [μm] | $R_{s,and} = 10$ μm $R_{s,cat} = 4$ μm |
| U | Open circuit potential of the electrode vs $Li/Li^+$ reference [V] | Refer to FIGS. 3A and 3B |

TABLE 1-continued

| Battery input parameters ($I_1 \ldots I_n$) and Estimation parameter set ($\theta$): | | |
|---|---|---|
| Parameter | Description | Values (descriptor "about" is applied to each value) |
| $\frac{dU}{dT}$ | Entropic coefficient [mV/K] | $\frac{dU_{and}}{dT} = -(58.29x^6) + (189.93x^5) - (240.4x^4) + (144.32x^3) - (38.87x^2) + (2.86x) + 0.10$ $\quad 0.0 \le x \le 1.0$ |
| | | $\frac{dU_{cat}}{dT} = -(190.34x^6) + (733.46x^5) - (1172.6x^4) + (995.88x^3) - (474.04x^2) + (119.72x) - 12.457$ $\quad 0.26 \le x \le 0.95$ |

TABLE 2

| Additional list of symbols and nomenclature: | |
|---|---|
| Nomenclature: | |
| $C_e$ | Electrolyte concentration [mol/m$^3$] |
| $C_s$ | Li-Concentration in solid phase [mol/m$^3$] |
| F | Faraday's constant [96487 C/mol] |
| i | Current density per unit active material area [A/m2] |
| $I_{app}$ | Applied current density [A/m$^2$] |
| j | Volumetric electrochemical reaction current density [A/m$^3$] |
| r | Radial coordinate of the active material particle [m] |
| t | Time [sec] |
| T | Cell Temperature [K] |
| $V_{cell}$ | Terminal cell voltage [V] |
| x | Electrode through-plane coordinate [m] |
| Greek Symbols: | |
| $\alpha$ | Butler Volmer Charge Transfer Coefficient [−] |
| $\eta$ | Overpotential [V] |
| $\phi_s$, $\phi_e$ | Solid and electrolyte phase potential [V] |
| Superscript/Subscript: | |
| and | Anode |
| cat | Cathode |
| AM | Active Material |
| e | Electrolyte phase |
| eff | Effective property |
| s | Solid-phase |

The macro-homogenous model 252 including the four-enumerated sub-models: Mass Conservation: 252A, Intercalation Kinetics: 252B, Charge Conservation: 252C, and Energy Conservation: 252D as shown in FIG. 2A are described herein. The first sub-model discussed is the mass conservation which is expressed based on set of equations represented as (3), below, and represents the species conservation in the electrolyte and the solid phase.

$$\varepsilon\frac{\partial C_e}{\partial t} = \frac{\partial}{\partial x}\left(D_e\frac{\varepsilon}{\tau}\frac{\partial C_e}{\partial x}\right) + \frac{(1-t_+)}{F}j \qquad (3)$$
$$\frac{\partial C_s}{\partial t} = \frac{1}{r^2}\frac{\partial}{\partial r}\left(D_s r^2\frac{\partial C_s}{\partial r}\right)$$

where $C_e$ is electrolyte concentration [mol/m$^3$], $\varepsilon$ is electrode porosity, $D_e$ is electrolyte phase diffusion [m$^2$/s], $\tau$ is pore-phase tortuosity, $t_+$ is electrolyte transference number, j is volumetric electrochemical reaction current density [A/m$^3$], F is Faraday's constant (96487 C/mol), r is radial coordinate of the active material particle [m], $C_s$ is Li-concentration in solid phase [mol/m$^3$], and $D_s$ is solid phase diffusion [m$^2$/s]. The first equation of the set of equations in (3) represents the conservation of $Li^+$ ions in the electrolyte phase and it is used for solving the electrolyte concentration ($C_e$). This equation is modeled based on the Nernst-Planck equation with "$D_{e,eff}$" being the effective electrolyte diffusivity and "j" representing the volumetric reaction current density in the electrode due to localized $Li^+$ ion production/destruction rate in the electrode. Also, "$t_+$" is the electrolyte transference number that describes the part of current transported by lithium ions, usually a constant. The second equation of the set of equations in (3) follows from the conservation of Lithium within the active material solid phase. It is based on Fick's law of diffusion, governing the species conservation in the solid phase, wherein we solve for the concentration of Lithium ($C_s$) in the radial direction in the active material particle with solid-phase diffusivity given by "$D_s$".

The primary electrochemical reaction occurring during the Li-ion cell operation is based upon the intercalation reaction. The reaction dynamics of an intercalation reaction at both electrodes are modeled based on the Butler-Volmer formulation with symmetric charge transfer. These equations are part of the intercalation kinetics sub-model are referenced in 252B in FIG. 2A, as expressed based on set of equations represented as (4), below:

$$j = a_s i\left(\exp\left(\frac{\alpha_a F\eta}{RT}\right) - \exp\left(-\frac{\alpha_c F\eta}{RT}\right)\right) \qquad (4)$$
$$\eta = \phi_s - \phi_e - U(C_s)$$
$$i = kFC_s^{0.5}C_e^{0.5}(C_{s,max} - C_s)^{0.5}$$

where j is a volumetric reaction current density of the intercalation reaction within the electrodes as a function of the various parameter, k is a temperature-dependent intercalation reaction constant, $C_s$ and $C_e$ represent the solid phase and electrolyte phase concentration, $C_{s,max}$ is the maximum Li-Concentration in solid phase [mol/m$^3$], $\alpha_a$ and $\alpha_c$ are Butler Volmer charge transfer coefficient for anode and cathode, respectively, F is Faraday's constant (96487 C/mol), η is overpotential [V], T is temperature [K], R is universal gas constant [J/mol], $\phi_s$, $\phi_e$ are solid and electrolyte phase potential [V], U is an open circuit potential of the electrode vs Li/$Li^+$ reference [V], and $a_s$ is an interfacial area of the electrode. The electrode's open circuit potential (U) has a functional dependence on the $C_s$ and is experimentally measured.

The charge conservation sub-model is based on the electroneutrality within the solid and electrolyte phase as referenced in 252C in FIG. 2B, as expressed based on a set of equations represented as (5), below:

$$\frac{\partial}{\partial x}\left(\sigma_s^{eff}\frac{\partial \phi_s}{\partial x}\right) = j \tag{5}$$

$$\frac{\partial}{\partial x}\left(\kappa_e\frac{\varepsilon}{\tau}\frac{\partial \phi_e}{\partial x}\right) + \frac{\partial}{\partial x}\left(\kappa_D\frac{\varepsilon}{\tau}\frac{\partial \ln C_e}{\partial x}\right) + j = 0$$

where $$\sigma_s^{eff}$$

is the effective electronic conductivity [S/m], $\phi_s$, $\phi_e$ are solid and electrolyte phase potential [V], $\kappa_e$ is the ionic conductivity of the electrolyte [S/m], ε is electrode porosity [–], τ is pore-phase tortuosity [–], $\kappa_D$ is the electrolyte diffusional conductivity [A/m], $C_e$ is the electrolyte concentration [mol/$m^3$], and j is the volumetric electrochemical reaction current density [A/$m^3$].

The first equation in the set of equations of (5) represents the charge conservation in the solid phase based on Ohm's law. This equation governs the variation of the solid phase potential ($\phi_s$) in the electrode where $$\sigma_s^{eff}$$

is the effective electronic conductivity of the composite porous electrode matrix. The second equation in the set of equations of (5) expresses charge conservation in the electrolyte phase and is used for solving the electrolyte potential within the cell ($\phi_e$). The flow of $Li^+$ ions results from two distinct components corresponding to the diffusional and migrational current. The diffusional part depends on the $Li^+$ concentration gradient and diffusional conductivity "$\kappa_D$", while the migrational current depends on the electrolyte potential gradients and ionic conductivity "$\kappa_e$".

The energy conservation sub-model is referenced in 252D in FIG. 2A, expressed based on a set of equation represented as (6), below:

$$mC_p\frac{dT}{dt} = Q_{gen} - hA_{cv}(T - T_\infty) \tag{6}$$

$$Q_{gen} = Q_{ohm} + Q_{kin} + Q_{rev} =$$

-continued $$A\int_0^{L_{and}+L_{sep}+L_{cat}}\left(\left(\sigma_s^{eff}\nabla\phi_s.\nabla\phi + k_e^{eff}\nabla\phi_e.\nabla\phi_e + k_D^{eff}\nabla \ln C_e.\nabla\phi_e\right) + (j\eta) + \left(jT\left(\frac{\partial U}{\partial T}\right)\right)\right)dx$$

where $mC_p$ is the cell heat capacity [J/K],

T is temperature [K], h is the convective Heat Transfer Coefficient [W/$m^2$–K], $A_{cv}$ is exposed surface area of the cell [$m^2$], $Q_{gen}$, $Q_{ohm}$, $Q_{kin}$, $Q_{rev}$, are heat generation, ohmic heat, kinetic heat, and reversible component of heat generation respectively, A is the cross-section area of cell [$m^2$], $L_{sep}$ is the separator thickness [m], $$\sigma_s^{eff}$$

is the effective electronic conductivity [S/m], $k_e$ is the ionic Conductivity of the electrolyte [S/m], $k_e$ is the electrolyte diffusional conductivity [A/m], $k_D$ is the electrolyte diffusional conductivity [A/m], j is the volumetric electrochemical reaction current density [A/$m^3$], η is overpotential [V], $\phi_s$, $\phi_e$ are solid and electrolyte phase potential [V], and $$\frac{\partial U}{\partial T}$$

is the Entropic coefficient [mV/K].

The electrochemical model described above is coupled with an energy conservation equation for determining the temporal evolution of temperature (T) of the Li-ion cell. Due to the high conduction and the natural convection around the cell, results in a low Biot number (a dimensionless quantity), enabling the treatment of the cell through the thermally lumped capacitance model as described in the set of equations of (6). The heat generation ($Q_{gen}$) within a lithium-ion battery is primarily due to its internal resistance. The heat generation terms have been decoupled into its physio-chemical source of origination. The ohmic heat ($Q_{ohm}$) arises due to gradients in the solid and electrolyte potential; Kinetic heat ($Q_{kin}$) arises due to the overpotential of electrochemical intercalation reactions and the reversible component of heat generation ($Q_{rev}$) arises due to entropy generated from electrochemical reactions.

Each of the battery sub-models have a dependence on the battery's physio-chemical parameters including the input parameter set $I_1$ . . . $I_n$ and the estimation parameter set θ. The simultaneous solution of these sub-models described from Eq. (3) through Eq. (6) using the above-described parameters results in the electrolyte concentration ($C_e$), solid-phase Li-concentration ($C_s$), solid-phase potential ($\phi_s$) and electrolyte potential ($\phi_e$) field within the battery computational domain. Based on this solution the model current ($I_{model}$) can be determined by the gradient of the solid phase potential at the electrode-current collector interface through a relation specified in Eq. (7).

$$I_{model} = -\sigma_s^{eff} A \frac{\partial \phi_s}{\partial x} |_{x=0} \tag{7}$$

An objective function ($f$) is introduced to measure the closeness between the experimental ($I_{exp}$) and model current ($I_{model}$). It is expressed based on the fit between the two currents ($I_{exp}$ and $I_{model}$) and measured using the coefficient of determination ($R^2$). The objective function ($f$) is the logarithm of the complement of R, as shown in Eq. (8).

$$R^2(\theta) = 1 - \frac{\sum_{l=1}^{m} (i_{exp,l} - i_{model,l}(\theta))}{\sum_{l=1}^{m} (i_{exp,l} - \overline{i_{exp,l}})} \tag{8}$$

$$f(\theta) = \log_{10}(1 - R(\theta))$$

$$g(\theta) = \left\{ \frac{\partial f}{\partial k}, \frac{\partial f}{\partial R_s}, \frac{\partial f}{\partial Y} \right\}$$

Here the $i_{exp,l}$ and $i_{model,l}$ are the experimentally measured and predicted model current at time step l, $i_{model,l}$ is obtained from the macro-homogeneous model described in sets of equations (3)-(7), $f$ is the objective function to be minimized, and it is equivalent to minimizing the difference between the model and experimental current in a least-squares sense, and g is the gradient of the objective function $f$ with respect to the estimation parameters ($\theta$) of interest and as g approaches zero, the $f$ approaches a minimum.

FIG. 2A shows a detailed block diagram elucidating the steps involved in the estimation of battery parameter set $\theta$ in the present disclosure. The macro-homogenous model including the four-enumerated sub-models (Mass Conservation: 252A, Intercalation Kinetics: 252B, Charge Conservation: 252C, and Energy Conservation: 252D) accepts as input a stochastic initialization of estimation parameter set $\theta_0$, other battery input parameters $I=\{I_1 \ldots I_n\}$ and experimental voltage pulses E(t). This estimation parameter set $\theta_0$ is only needed for the first iteration (i=0), either they are based on a priori knowledge of the battery 102 from, e.g., the manufacturer or for subsequent startups, the initialization of parameters $\theta$, is obtained from the previous startup $\theta_{optimal}$. Beyond first iteration the input parameter set is the newly generated parameter set ($\theta_{i+1}$) by the optimization engine. A comparison is made between the experimental current $I_{exp}(t)$ logged by BMS referenced as 260, and the generated model current $I_{model}(t)$ by establishing an objective function ($f_i$) based on their fit as referenced in 254. The model establishes a relationship between model current ($I_{model}$) and estimation parameter set ($\theta_i$) as a result between objective function ($f$) and ($\theta_i$) as well, which is used to determine the gradient of objective function ($g_i$) with respect to ($\theta$) as referenced in 254. This step represents the entry into an optimization loop for estimation of battery parameters $\theta$. As referenced in 256, in each successive iteration a new set of parameters $\theta_{i+1}$ is determined to iteratively refine the estimates based on the history of previous estimates $\theta_i$, $\theta_{i-1}$, $\theta_{i-2}$ . . . , objective functions and gradients by using an optimization method e.g., the gradient descent technique. Once the differences between former ($\theta_i$) and updated parameters ($\theta_{i+1}$) fall below a predetermined threshold, then $\theta_{optimal}$ is inferred, as shown in block 258. If, however, the difference is larger than the predetermined threshold, then the parameter set $\{\theta_{i+1}\}$ is provided back to block 252 for the next iteration. This method is not limited to gradient descent approach for finding the new parameter set $\theta_{i+1}$ which has been used in this actual reduction to practice. Various methods to determine new parameter set within the skillset of a person having ordinary skill in the art is within the scope of the present disclosure.

The state of the battery can be inferred from $\theta_{optimal}$, indicating the condition of battery e.g., how fast the battery can be safely charged, charge left in the battery. Once the optimal battery parameter $\theta_{optimal}$ is determined from previous steps, it is passed on along with battery input parameter Ito a prediction engine consisting of the macrohomogeneous model of battery to generate graphs as shown in FIG. 2B for assessing battery performance in a specified target application. The state of battery descriptors namely the state of charge, state of health and state of energy descriptor are calculated based on set of equation (9) and graphs provided in FIG. 2B.

$$\theta_{optimal} = \{k, R_s, Y\} \tag{9}$$

$$\text{State of Charge } (SOC) = 1 - Y,$$

$$\text{State of Health } (SOH) = \frac{C_{discharge}}{C_{max}}, \text{ and,}$$

$$\text{State of Energy } (SOE) = \frac{\int_0^{C_{discharge}} V dC}{\int_0^{C_{max}} V dC}$$

Here $C_{max}$ is the theoretically maximum charge held by a pristine battery [Columb], $C_{discharge}$ is the nominal charge held by the aged battery [Columb], V is the voltage across the terminals of the battery [V], and Y is the lithiation state of the electrode [–].

Figure 2B:
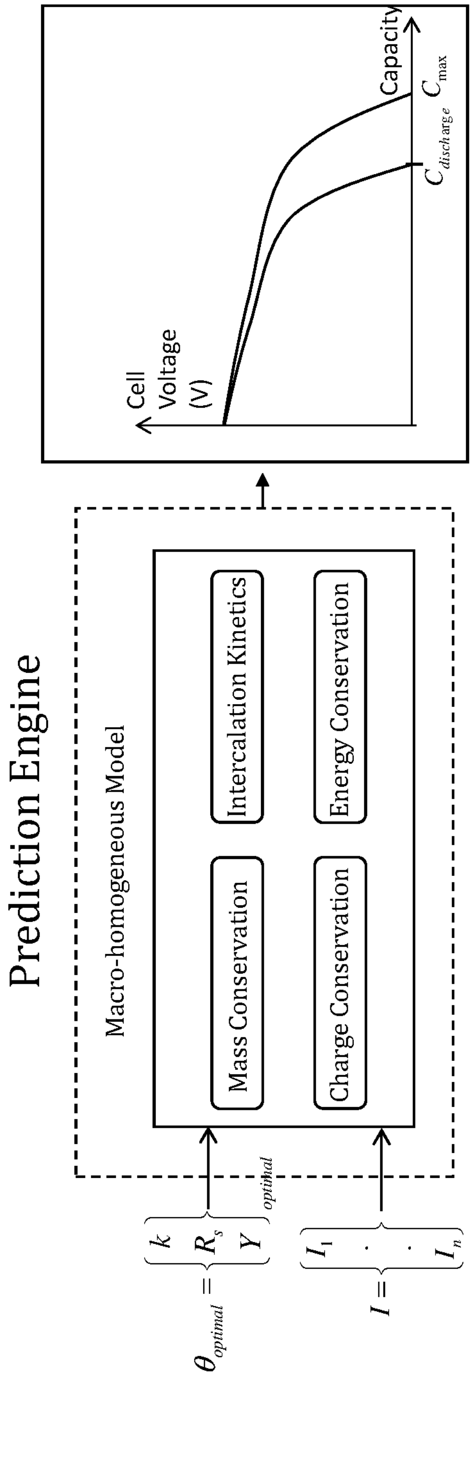
FIG. 2B is a block diagram of a prediction engine, according to the present disclosure.

It should be noted that the same macro-homogeneous model is used in both the optimization engine (FIG. 2A) and the prediction engine (FIG. 2B). The output of the macro-homogenous model depends on the application—i.e. how much power it is expected to provide or how fast of a charge it can take. The final state of battery metric can be obtained using one or more applied loads on the battery representative of the application of interest.

Referring to FIGS. 3A and 3B, plots of diffusivity in $cm^2/s$ and open circuit potential in V are provided vs. x in $Li_xC_6$ (FIG. 3A) and x in $Li_x[NiCoMn]O_2$. These are experimentally obtained by performing the galvanostatic intermittent titration technique (GITT) for the half cells constructed from the commercial cell under consideration. In GITT testing, for each pulse, a C/10 current was applied for 2.5 min, followed by a 2 h rest period. Ultimately these tests provide the estimate of the diffusivity ($D_s$) and open circuit potential (OCP) curve of each electrode as a function of the lithiation fraction (x) of the electrode. The macro-homogeneous model described employs these accurate concentration-dependent diffusivities and OCP for a better fit to experimental current data. The results are shown in FIGS. 3A and 3B are experimentally measured values of diffusivity and open circuit potential. Open circuit potential and phase diffusivity have a major impact on model current ($I_{model}$). Since this parameter is critically important it is described here to show that concentration-dependent diffusivity and open circuit potential have been accounted for in the model. The OCP and diffusivity provided herein are applicable to a lithium-ion battery, e.g., the LGChem 18650 Li-ion cell, tested in an actual reduction to practice. The model and procedure described are general and applicable to different battery types and chemistry, where these parameters will need to be determined for each different battery type under consideration.

Those having ordinary skill in the art will recognize that numerous modifications can be made to the specific implementations described above. The implementations should not be limited to the particular limitations described. Other implementations may be possible.

The invention claimed is:

1. A state of battery testing system, comprising:

a charger adapted to charge and test a battery having a positive and negative terminals;

a load adapted to be selectively coupled across the positive and negative terminals of the battery;

a controller having a processer executing software on a non-transient memory and adapted to:

applying a predetermined voltage pulse across the positive and negative terminals of the battery, selectively applying the load to the battery, measure current through the load, logging the measured current as $I_{exp}$, and establish a model based on:

establishing an initial estimation of state of the battery ($\theta_0$) based on a set of parameters including a) reaction rate constant for intercalation ($k_0$) for electrodes of the battery, b) average particle size of active material $R_{s0}$, and c) a Li-intercalation fraction of the electrode ($Y_0$); and establishing a modeled state of battery ($\theta_i$) based on a plurality of internal parameters of the battery, wherein the model is adapted to output a model current ($I_{model}$) through the load disposed between a modeled positive and negative terminals;

inputting $\theta_0$ and the plurality of internal parameters to the model, thereby generating the $I_{model}$, generating an objective function ($f$) based on a comparison of $I_{model}$ and $I_{exp}$;

iteratively optimizing $\theta_i$ in a loop based on the objective function $f$, and a gradient (g) of objective function $f$;

updating $\theta_i$ ($k_i$, $R_{si}$, and $Y_i$) based on direction of the steepest descent of $f$, determining if change in $\theta_i$ as compared to values from an immediate previous iteration exceeds a predetermined limit;

if no, then establishing $\theta_{optimal}$;

if yes, then update $\theta_0$ to $\theta_i$ and repeats the loop; and inputting the established $\theta_{optimal}$ to the model to thereby predict state of the battery including how fast the battery can be charged for a target application, how much charge remains in the battery, or a combination thereof.

2. The system of claim 1, wherein the model is based on a plurality of sub-models, including i) mass conservation, ii) intercalation kinetics, iii) charge conservation, and iv) energy conservation.

3. The system of claim 2, the mass conservation sub-model is expressed as:

$$\varepsilon\frac{\partial C_e}{\partial t} = \frac{\partial}{\partial x}\left(D_e\frac{\varepsilon}{\tau}\frac{\partial C_e}{\partial x}\right) + \frac{(1-t_+)}{F}j$$

representing species conservation in the electrolyte as conservation of Li ions in the electrolyte thus representing the electrolyte concentration ($C_e$), ε is electrode porosity, t+ is the electrolyte transference number that describes the part of current transported by lithium ions, F is the Faraday constant, and j is the volumetric reaction current density in the electrode due to localized Li+ ion production/destruction rate in the electrode.

4. The system of claim 2, the mass conservation sub-model further expressed as:

$$\frac{\partial C_s}{\partial t} = \frac{1}{r^2}\frac{\partial}{\partial r}\left(D_s r^2\frac{\partial C_s}{\partial r}\right)$$

representing conservation of lithium within active material solid phase, wherein $D_s$ is solid-phase diffusivity, $C_s$ is the concentration of lithium in the radial direction in the active material particle, $D_e$ is the electrolyte diffusivity, and r is the radial coordinates in active material particle.

5. The system of claim 2, the intercalation kinetics sub-model is expressed as:

$$j = a_s i\left(\exp\left(\frac{\alpha_a F\eta}{RT}\right) - \exp\left(-\frac{\alpha_c F\eta}{RT}\right)\right)$$

$$\eta = \phi_s - \phi_e - U(C_s)$$

$$i = kFC_s^{0.5}C_e^{0.5}(C_{s,max} - C_s)^{0.5}$$

wherein j represents volumetric reaction current density in electrodes, k represents the temperature-dependent intercalation reaction constant, $C_s$ and $C_e$ represent solid phase and electrolyte phase concentration, and $a_s$ represents interfacial area of the electrode, wherein the electrode's open circuit potential (U) has a functional dependence on the Cs and is experimentally measured.

6. The system of claim 2, the charge conservation sub-model is expressed as:

$$\frac{\partial}{\partial x}\left(\sigma_s^{eff}\frac{\partial \phi_s}{\partial x}\right) = j$$

representing charge conservation in the solid phase based on variation of solid phase potential ($\phi_s$) in the electrode where $$\sigma_s^{eff}$$

is effective electronic conductivity of the composite porous electrode matrix.

7. The system of claim 2, the charge conservation sub-model is further expressed as:

$$\frac{\partial}{\partial x}\left(\kappa_e \frac{\varepsilon}{\tau}\frac{\partial \phi_e}{\partial x}\right)+\frac{\partial}{\partial x}\left(\kappa_D \frac{\varepsilon}{\tau}\frac{\partial \ln C_e}{\partial x}\right)+j=0$$

representing charge conservation in the electrolyte phase solving for the electrolyte potential within the battery ($\phi_e$), wherein flow of $Li^+$ ions results from two distinct components corresponding to a diffusional component and a migrational current, wherein the diffusional conductivity depends on the $Li^+$ concentration gradient and diffusional conductivity "$\kappa_D$", while the migrational current depends on the electrolyte potential gradients and ionic conductivity "$\kappa_e$".

8. The system of claim 2, the energy conservation sub-model is expressed as:

$$mC_p\frac{dT}{dt}=Q_{gen}-hA_{cv}(T-T_\infty)$$

wherein the electrochemical model described above is coupled with an energy conservation equation for determining temporal evolution of temperature (T) of the Li-ion cell, wherein $Q_{gen}$ represents heat generation with a lithium-ion battery arising due to battery's internal resistance.

9. The system of claim 8, the energy conservation sub-model is further expressed as:

$$Q_{gen}=Q_{ohm}+Q_{kin}+Q_{\gamma ev}=$$
$$A\int_0^{L_{and}+L_{sep}+L_{cat}}\left(\begin{matrix}\left(\sigma_s^{eff}\nabla\phi_s\cdot\nabla\phi_s+k_s^{eff}\nabla\phi_e\cdot\nabla\phi_e+k_D^{eff}\nabla\ln C_e\cdot\nabla\phi_e\right)+\\(j\eta)+\left(jT\left(\frac{\partial U}{\partial T}\right)\right)\end{matrix}\right)dx$$

wherein $Q_{ohm}$ is ohmic heat arising due to gradients in the solid and electrolyte potential, $Q_{kin}$ is kinetic heat arising due to overpotential to electrochemical intercalation reactions, $Q_{rev}$ is reversible component of heat generation arising due to entropy generated from electrochemical reactions.

10. The system of claim 1, wherein the processor is further adapted to determine state of charge, state of health and state of energy of the battery from the $\theta_{optimal}$ based on:

$$\theta_{optimal}=\{k, R_s, Y\}$$

$$\text{State of Charge }(SOC)=Y,$$

$$\text{State of Health }(SOH)=\frac{C_{discharge}}{C_{max}},\text{ and,}$$

$$\text{State of Energy }(SOE)=\frac{\int_0^{C_{discharge}} VdC}{\int_0^{C_{max}} VdC}$$

where $C_{max}$ is the theoretically maximum charge held by the battery [Columb], $C_{discharge}$ is the nominal charge held by the battery [Columb], V is the voltage across the terminals of the battery [V], and Y is the lithiation state of the electrode [–].

11. A state of battery testing method, comprising:

charging a battery having a positive and negative terminals;

applying a predetermined voltage pulse across the positive and negative terminals of the battery;

selectively coupling a load across the positive and negative terminals of the battery;

measuring current through the load;

logging the measured current as $I_{exp}$, establishing a model based on:

establishing an initial estimation of state of the battery ($\theta_0$) based on a set of parameters including a) reaction rate constant for intercalation ($k_0$) for electrodes of the battery, b) average particle size of active material $R_{s0}$, and c) a Li-intercalation fraction of the electrode ($Y_0$);

establishing a modeled state of battery ($\theta_i$) based on a plurality of internal parameters of the battery, wherein the model is adapted to output a model current ($I_{model}$) through the load disposed between a modeled positive and negative terminals;

inputting $\theta_0$ and the plurality of internal parameters to the model, thereby generating the $I_{model}$, generating an objective function (*f*) based on a comparison of $I_{model}$ and $I_{exp}$;

iteratively optimizing $\theta_i$ in a loop based on objective function *f*, and gradient (g) of objective function *f*;

updating $\theta_i$ ($k_i$, $R_{si}$, and $Y_i$) based on direction of the steepest descent of *f*, and determining if change in $\theta_i$ as compared to values from an immediate previous iteration exceeds a predetermined limit;

if no, then outputting $\theta_{optimal}$;

if yes, then updating $\theta_0$ to $\theta_i$ and repeating the loop; and inputting the established $\theta_{optimal}$ to the model to thereby predict state of the battery including how fast the battery can be charged for a target application, how much charge remains in the battery, or a combination thereof.

12. The method of claim 11, wherein the model is based on a plurality of sub-models, including i) mass conservation, ii) intercalation kinetics, iii) charge conservation, and iv) energy conservation.

13. The method of claim 12, the mass conservation sub-model is expressed as:

$$\varepsilon\frac{\partial C_e}{\partial t}=\frac{\partial}{\partial x}\left(D_e\frac{\varepsilon}{\tau}\frac{\partial C_e}{\partial x}\right)+\frac{(1-t_+)}{F}j$$

representing species conservation in the electrolyte as conservation of Li ions in the electrolyte thus representing the electrolyte concentration ($C_e$), ε is electrode porosity, t+ is the electrolyte transference number that describes the part of current transported by lithium ions, F is the Faraday constant, and j is the volumetric reaction current density in the electrode due to localized Li+ ion production/destruction rate in the electrode.

14. The method of claim 12, the mass conservation sub-model further expressed as:

$$\frac{\partial C_s}{\partial t} = \frac{1}{r^2}\frac{\partial}{\partial r}\left(D_s r^2 \frac{\partial C_s}{\partial r}\right)$$

representing conservation of lithium within active material solid phase, wherein $D_s$ is solid-phase diffusivity, $C_s$ is the concentration of lithium in the radial direction in the active material particle, $D_e$ is the electrolyte diffusivity, and r is the radial coordinates in active material particle.

15. The method of claim 12, the intercalation kinetics sub-model is expressed as:

$$j = a_s i\left(\exp\left(\frac{\alpha_a F\eta}{RT}\right) - \exp\left(-\frac{\alpha_c F\eta}{RT}\right)\right)$$

$$\eta = \phi_s - \phi_e - U(C_s)$$

$$i = kFC_s^{0.5}C_e^{0.5}(C_{s,max} - C_s)^{0.5}$$

wherein j represents volumetric reaction current density in electrodes, k represents the temperature-dependent intercalation reaction constant, $C_s$ and $C_e$ represent solid phase and electrolyte phase concentration, and $a_s$ represents interfacial area of the electrode, wherein the electrode's open circuit potential (U) has a functional dependence on the Cs and is experimentally measured.

16. The method of claim 12, the charge conservation sub-model is expressed as:

$$\frac{\partial}{\partial x}\left(\sigma_s^{eff}\frac{\partial \phi_s}{\partial x}\right) = j$$

representing charge conservation in the solid phase based on variation of solid phase potential ($\phi_s$) in the electrode where $$\sigma_s^{eff}$$

is effective electronic conductivity of the composite porous electrode matrix.

17. The method of claim 12, the charge conservation sub-model is further expressed as:

$$\frac{\partial}{\partial x}\left(\kappa_e \frac{\varepsilon}{\tau}\frac{\partial \phi_e}{\partial x}\right) + \frac{\partial}{\partial x}\left(\kappa_D \frac{\varepsilon}{\tau}\frac{\partial \ln C_e}{\partial x}\right) + j = 0$$

representing charge conservation in the electrolyte phase solving for the electrolyte potential within the battery ($\phi_e$), wherein flow of $Li^+$ ions results from two distinct components corresponding to a diffusional component and a migrational current, wherein the diffusional conductivity depends on the $Li^+$ concentration gradient and diffusional conductivity "$\kappa_D$", while the migrational current depends on the electrolyte potential gradients and ionic conductivity "$\kappa_e$".

18. The method of claim 12, the energy conservation sub-model is expressed as:

$$mC_p\frac{dT}{dt} = Q_{gen} - hA_{cv}(T - T_\infty)$$

wherein the electrochemical model described above is coupled with an energy conservation equation for determining temporal evolution of temperature (T) of the Li-ion cell, wherein $Q_{gen}$ represents heat generation with a lithium-ion battery arising due to battery's internal resistance.

19. The method of claim 18, the energy conservation sub-model is further expressed as:

$$Q_{gen} = Q_{ohm} + Q_{kin} + Q_{rev} =$$

$$A\int_0^{L_{and}+L_{sep}+L_{cat}}\left(\begin{array}{l}(\sigma_s^{eff}\nabla\phi_s\cdot\nabla\phi_s + k_e^{eff}\nabla\phi_e\cdot\nabla\phi_e + k_D^{eff}\nabla\ln C_e\cdot\nabla\phi_e) + \\ (j\eta) + \left(jT\left(\frac{\partial U}{\partial T}\right)\right)\end{array}\right)dx$$

wherein $Q_{ohm}$ is ohmic heat arising due to gradients in the solid and electrolyte potential, $Q_{kin}$ is kinetic heat arising due to overpotential to electrochemical intercalation reactions, $Q_{rev}$ is reversible component of heat generation arising due to entropy generated from electrochemical reactions.

20. The method of claim 11, further comprising:

determining state of charge, state of health and state of energy of the battery from the $\theta_{optimal}$ based on:

$$\theta_{optimal} = \{k, R_s, Y\}$$

$$\text{State of Charge } (SOC) = Y,$$

$$\text{State of Health } (SOH) = \frac{C_{discharge}}{C_{max}}, \text{ and,}$$

$$\text{State of Energy } (SOE) = \frac{\int_0^{C_{discharge}} VdC}{\int_0^{C_{max}} VdC}$$

where $C_{max}$ is the theoretically maximum charge held by the battery [Columb], $C_{discharge}$ is the nominal charge held by the battery [Columb], V is the voltage across the terminals of the battery [V], and Y is the lithiation state of the electrode [–].

* * * * *